United States Patent
Kosugi et al.

(10) Patent No.: US 6,559,489 B2
(45) Date of Patent: *May 6, 2003

(54) SEMICONDUCTOR DEVICE AND METHOD OF MANUFACTURING THE SAME

(75) Inventors: Ryuichi Kosugi, Hyogo (JP); Shigeki Ohbayashi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/544,983

(22) Filed: Apr. 7, 2000

(65) Prior Publication Data

US 2002/0163022 A1 Nov. 7, 2002

(30) Foreign Application Priority Data

Sep. 27, 1999 (JP) ............................................. 11-272283

(51) Int. Cl.[7] .............................................. H01L 29/72
(52) U.S. Cl. ........................ 257/288; 257/390; 257/392; 257/393; 257/401; 438/151; 438/221; 438/225; 438/689; 438/644
(58) Field of Search ................................ 257/390, 288, 257/392, 393, 401; 438/151, 221, 225, 689, 694

(56) References Cited

U.S. PATENT DOCUMENTS 6,169,313 B1 * 1/2001 Tsutsumi et al. ........... 257/390

FOREIGN PATENT DOCUMENTS

| JP | 61-181147 | 8/1986 |
| JP | 5-235279 | 9/1993 |
| JP | 9-134956 | 5/1997 |
| JP | 10-229168 | 8/1998 |

OTHER PUBLICATIONS

"A Novel 6T–SRAM Cell Technology Designed with Rectangular Patterns Scalable beyond 0.18 μm Generation and Desirable for Ultra High Speed Operation", M. Ishida et al., IEDM 98, 1998, pp 201–204.

* cited by examiner

Primary Examiner—Edward Wojciechowicz
(74) Attorney, Agent, or Firm—McDermott, Will & Emery

(57) ABSTRACT

A semiconductor device capable of a high-speed operation is provided. The semiconductor device is provided with low concentration impurity regions, a gate electrode formed with gate oxide film interposed between the gate electrode and a silicon substrate, an etching stopper, an interlayer insulating film having a contact hole and having an etching rate greater than that of the etching stopper, a high concentration impurity region formed by implanting an impurity into the silicon substrate through the contact hole, a plug layer filling the contact hole, and an interconnection layer.

10 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more specifically to a semiconductor device having a contact hole and a method of manufacturing such a semiconductor device.

2. Description of the Background Art

In recent years, as the semiconductor devices has undergone further miniaturization, the distance between the electrodes formed on a surface of a semiconductor substrate has become smaller. In addition, between those electrodes, the amount of margin in the distance between an electrode and a contact hole formed in an interlayer insulating film is also becoming smaller.

Accordingly, technologies relating to the so-called self-aligned contact hole is being developed in which an etching stopper such as a nitride film is formed to cover a gate electrode, and in which a contact hole is not allowed to reach the gate electrode even when the contact hole and the gate electrode overlap in a planar manner. For instance, a semiconductor device having a contact hole formed in a self-aligned manner is described in Japanese Patent Laying-Open No. 9-134956.

FIG. 23 is a cross sectional view of a conventional semiconductor device described in the above publication. As seen in FIG. 23, an element isolating region 514 is formed on a surface of a semiconductor substrate 513. In addition, a conductive region 513a is formed in the part of the surface of semiconductor substrate 513 where element isolating region 514 is not formed.

An interconnection 516 is formed on semiconductor substrate 513 with a gate insulating film 515 interposed therebetween. A silicon oxide film 517 is formed on interconnection 516, and sidewalls 518 are formed in contact with interconnection 516.

Further, an oxide film 519 and an etching stopper film 520 are formed covering element isolation region 514, sidewalls 518, and silicon oxide film 517. Etching stopper film 520 consists of an insulating film containing nitrogen molecules such as a silicon nitride film.

An interlayer insulating film 521 is formed covering etching stopper film 520. In interlayer insulating film 521, a hole reaching conductive region 513a is formed. A contact 522 is formed within the hole. An upper-layer interconnection 523 is formed in contact with contact 522.

When manufacturing such a semiconductor device, oxide film 519 and etching stopper film 520 are formed to cover interconnection 516, silicon oxide film 517, and sidewalls 518. Interlayer insulating film 521 is formed to cover etching stopper film 520, and then a hole reaching conductive region 513a is formed in interlayer insulating film 521. At this time, interlayer insulating film 521 is etched with the condition that the etching rate of interlayer insulating film 521 is greater than the etching rate of etching stopper film 520. Therefore, a portion of etching stopper film 520 where it is thick in the vertical direction, i.e. the portion of etching stopper film 520 having a large thickness in the vertical direction where etching stopper film 520 is formed along sidewalls 518, is not etched easily. As a result, the etching of sidewalls 518 can be prevented so that the hole will only reach conductive region 513a even when a large hole is formed, and is less likely to reach sidewalls 518 and interconnection 516.

Thus, a hole can be formed without allowing the hole to reach interconnection 516 even when the margin of the distance between the hole and interconnection 516 is small.

The problems that arise in a conventional semiconductor device as shown in FIG. 23 will be described below.

Recently, researches are made in relation not only to the miniaturization but also to a higher-speed operation of a semiconductor device. In order to increase the operating speed of a semiconductor device, there is a need to reduce the contact resistances between various conductive layers formed in a semiconductor device. Further, the electric resistance of a conductive layer itself needs to be reduced.

A problem involved in a conventional semiconductor device as shown in FIG. 23 is that the contact resistance between contact 522 and conductive region 513a is too high to achieve a high-speed operation of the semiconductor device.

Moreover, the cross section of upper-layer interconnection 523 must be made larger in order to reduce the electric resistance of upper-layer interconnection 523. For this purpose, the width or the thickness of upper-layer interconnection 523 might be increased. If the width of upper-layer interconnection 523 is increased, however, the semiconductor device cannot be miniaturized. Moreover, if the thickness of upper-layer interconnection 523 is increased, the evenness of the semiconductor device cannot be ensured. Therefore, conventionally, it was too difficult to enlarge the cross section of upper-layer interconnection 523 that a higher-speed operation of the semiconductor device could not be achieved.

SUMMARY OF THE INVENTION

Thus, the present invention is made to solve the above-described problems. An object of the present invention is to provide a semiconductor device capable of a high-speed operation and having a small contact resistance between two conductive regions as well as to provide a method of manufacturing such a semiconductor device.

Moreover, another object of the present invention is to provide a semiconductor device capable of a high-speed operation with a conductive layer having a small electric resistance as well as to provide a method of manufacturing such a semiconductor device.

A semiconductor device according to one aspect of the present invention is provided with a semiconductor substrate, a pair of low concentration impurity regions, a gate electrode, a protective film, an interlayer insulating film, a high concentration impurity region, and a conductive layer. Low concentration impurity regions having a relatively low impurity concentration are formed spaced apart from one another on a surface of the semiconductor substrate. The gate electrode is formed between the pair of low concentration impurity regions on the semiconductor substrate with a gate insulating film interposed between the gate electrode and the semiconductor substrate. The protective film covers the gate electrode. The interlayer insulating film covers the gate electrode and the protective film, and has a hole reaching an impurity region. The etching rate of the interlayer insulating film is greater than that of the protective film when a prescribed etchant is employed. The high concentration impurity region is formed by implanting an impurity into the semiconductor substrate through a hole, and has a relatively high impurity concentration within a low concentration impurity region. The conductive layer fills the hole such that it is electrically connected to the high concentration impurity region.

In a semiconductor device thus configured, the high concentration impurity region is formed by implanting an impurity into the semiconductor substrate through a hole so that the bottom of the hole forms the high concentration impurity region. Since the conductive layer is provided to fill the hole such that an electrical connection to the high concentration impurity region is established, the conductive layer is electrically connected to the impurity region that has a relatively high impurity concentration. Thus, the hole and the surface of the high concentration impurity region that is connected through the hole do not shift out of position. Therefore, an increase in the contact resistance between the conductive layer and the high concentration impurity region can be prevented, and a high-speed operation of the semiconductor device is achieved.

Preferably, the protective film includes a nitride film and the interlayer insulating film includes an oxide film.

Moreover, the protective film preferably is at least one of a silicon oxynitride film (SiON) and a silicon nitride film (SiN), and the interlayer insulating film preferably is a silicon oxide film ($SiO_2$).

Preferably, the conductive layer includes a plug layer that fills the hole such that the plug layer is electrically connected to the high concentration impurity region, and an interconnection layer formed on the interlayer insulating film such that an electrical connection with the plug layer is established.

In this case, since the plug layer can be formed of a material that easily fills the hole, the electrical connection between the plug layer and the high concentration impurity region is further ensured. As a result, a semiconductor device capable of a high-speed operation with an even lower contact resistance can be provided.

Preferably, the semiconductor device is a static semiconductor memory device. In this case, an operation of a static semiconductor memory device at a higher speed becomes possible.

A semiconductor device according to another aspect of the present invention is provided with a semiconductor substrate, an interlayer insulating film, and a conductive layer. The semiconductor substrate has a conductive region. The interlayer insulating film has a hole reaching the conductive region of the semiconductor substrate. The conductive layer fills the hole such that an electrical connection with the conductive region is established. The hole is defined by a relatively high sidewall and a relatively low sidewall of the interlayer insulating film.

In a semiconductor device thus configured, since the hole is defined by a relatively high sidewall and a relatively low sidewall, the cross sectional area of the conductive layer can be increased by expanding the conductive layer above the low sidewall. Thus, the electrical resistance of the conductive layer becomes smaller, and thereby a semiconductor device capable of a high-speed operation can be provided.

Preferably, the semiconductor device is further provided with a gate electrode formed on the semiconductor substrate with a gate insulating film interposed therebetween, and a protective film covering the gate electrode and having an etching rate that is smaller than that of the interlayer insulating film when using a prescribed etchant.

In this case, the gate electrode is covered by the protective film having an etching rate smaller than the etching rate of the interlayer insulating film. Therefore, when forming a hole by etching the interlayer insulating film, the hole is mainly etched into the interlayer insulating film while the protective film is not as easily etched. Consequently, the hole does not reach the gate electrode covered by the protective film so that the conductive layer filling the hole and the gate electrode is prevented from becoming short-circuited.

Preferably, the protective film includes a nitride film and the interlayer insulating film includes an oxide film.

Further, the protective film preferably is at least one of a silicon oxynitride film and a silicon nitride film, and the interlayer insulating film preferably is a silicon oxide film.

The conductive region preferably includes a low concentration impurity region formed close to the gate electrode and having a relatively low impurity concentration and a high concentration impurity region formed at a location remote from the gate electrode and having a relatively high impurity concentration.

In this case, since the conductive region includes a high concentration impurity region having a relatively high impurity concentration, the high-speed operation of a semiconductor device formed by the gate electrode and the conductive region is achieved.

Preferably, the low concentration impurity region is formed by implanting an impurity into the semiconductor substrate using the gate electrode as a mask, and the high concentration impurity region is formed by implanting an impurity into the semiconductor substrate through a hole.

In this case, since the high concentration impurity region is formed by implanting an impurity into the semiconductor substrate through a hole, the bottom of the hole forms the high concentration impurity region. Since the conductive layer is formed by filling the hole, the conductive layer is electrically connected to the high concentration impurity region having a relatively high impurity concentration. As a result, the contact resistance between the conductive layer and the high concentration impurity region can be reduced, thereby achieving a high-speed operation of a semiconductor device.

Preferably, the conductive layer includes a plug layer filling a hole such that the plug layer is electrically connected to the high concentration impurity region, and an interconnection layer formed on an interlayer insulating film such that an electrical connection with the plug layer is established.

In this case, the electrical connection between the plug layer and the high concentration impurity region can be ensured by forming the plug layer with a material that easily fills the hole. As a consequence, the contact resistance becomes even smaller so that a high-speed operation of a semiconductor device becomes possible.

Preferably, the interlayer insulating film covering the gate electrode has a sidewall that is relatively low in height.

Moreover, the interlayer insulating film covering the gate electrode preferably has a sidewall that is relatively high in height.

Furthermore, the semiconductor device preferably is a static semiconductor memory device. In this case, a static semiconductor memory device capable of a high-speed operation can be provided.

A method of manufacturing a semiconductor device according to one aspect of the present invention includes the following steps of:

(1) forming a gate electrode on a semiconductor substrate with a gate insulating film interposed therebetween;

(2) implanting an impurity into the semiconductor substrate using the gate electrode as a mask to form a pair of low concentration impurity regions having a relatively low impurity concentration and being spaced apart from one another on a surface of the semiconductor substrate;

(3) forming a protective film covering the gate electrode and the semiconductor substrate;

(4) forming an interlayer insulating film covering the gate electrode and the protective film and having an etching rate greater than that of the protective film when a prescribed etchant is used;

(5) etching the interlayer insulating film with the condition that the etching rate of the interlayer insulating film is greater than that of the protective film to expose the protective film, and thereafter etching the protecting film with the condition that the etching rate of the protective film is greater than that of the interlayer insulating film to form in the interlayer insulating film a hole reaching a low concentration impurity region;

(6) implanting an impurity into the semiconductor substrate through the hole to form a high concentration impurity region having a relatively high impurity concentration within the low concentration impurity region;

(7) depositing a conductive material on the interlayer insulating film so as to fill the hole; and (8) etching the conductive material while leaving the conductive material within the hole to form a conductive layer electrically connected to the high concentration impurity region.

According to this method, a high concentration impurity region is formed by implanting an impurity through the hole so that the bottom of the hole forms the high concentration impurity region. Thus, the hole and the surface of the high concentration impurity region connected through the hole do not shift out of position. Since the conductive layer is formed such that an electrical connection with the high concentration impurity region is established, the increase in contact resistance between the conductive layer and the high concentration impurity region can be prevented. As a result, a semiconductor device capable of a high-speed operation can be provided.

Preferably, the step of forming a conductive layer includes etching back the entire surface of the conductive material while leaving the conductive material within the hole to form a plug layer electrically connected to the high concentration impurity region, and forming an interconnection layer on the interlayer insulating film such that an electrical connection with the plug layer is established.

In this case, since the plug layer is formed by the etchback of the entire surface, the hole is positively filled with the plug layer. Consequently, no contact failure arises between the plug layer and the high concentration impurity region. Thus, a semiconductor device that is highly reliable and capable of a high-speed operation can be provided.

A method of manufacturing a semiconductor device according to another aspect of the present invention includes the following steps of:

(1) forming an interlayer insulating film on a semiconductor substrate having a conductive region;

(2) etching the interlayer insulating film to form in the interlayer insulating film a hole that reaches the conductive region and that is defined by a pair of sidewalls opposing one another;

(3) forming a resist covering one sidewall and filling the hole;

(4) removing a portion of the interlayer insulating film using the resist as a mask such that the other sidewall becomes lower in height;

(5) depositing a conductive material on the interlayer insulating film so as to fill the hole; and (6) etching the conductive material while leaving the conductive material within the hole to form a conductive layer electrically connected to the conductive region.

According to this method, the conductive layer filling the hole is formed by removing a portion of the interlayer insulating film such that the other sidewall becomes lower. Therefore, the conductive layer is also formed on the interlayer insulating film in a region having the lowered height so that the cross section of the conductive layer can be increased. As a result, the electric resistance of the conductive layer becomes small, and a semiconductor device capable of a high-speed operation can be provided.

Preferably, the step of forming the conductive layer includes etching back the entire surface of the conductive material while leaving the conductive material within the hole to form a plug layer electrically connected to the conductive region, and forming an interconnection layer on the interlayer insulating film such that an electrical connection with the plug layer is established.

In this case, since the plug layer is formed by the etchback of the entire surface, the plug layer positively remains within the hole. Consequently, contact failure between the plug layer and the high concentration impurity region can be prevented. Thus, a semiconductor device that is highly reliable and capable of a high-speed operation can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with reference to the drawings.

First Embodiment

Figure 1:
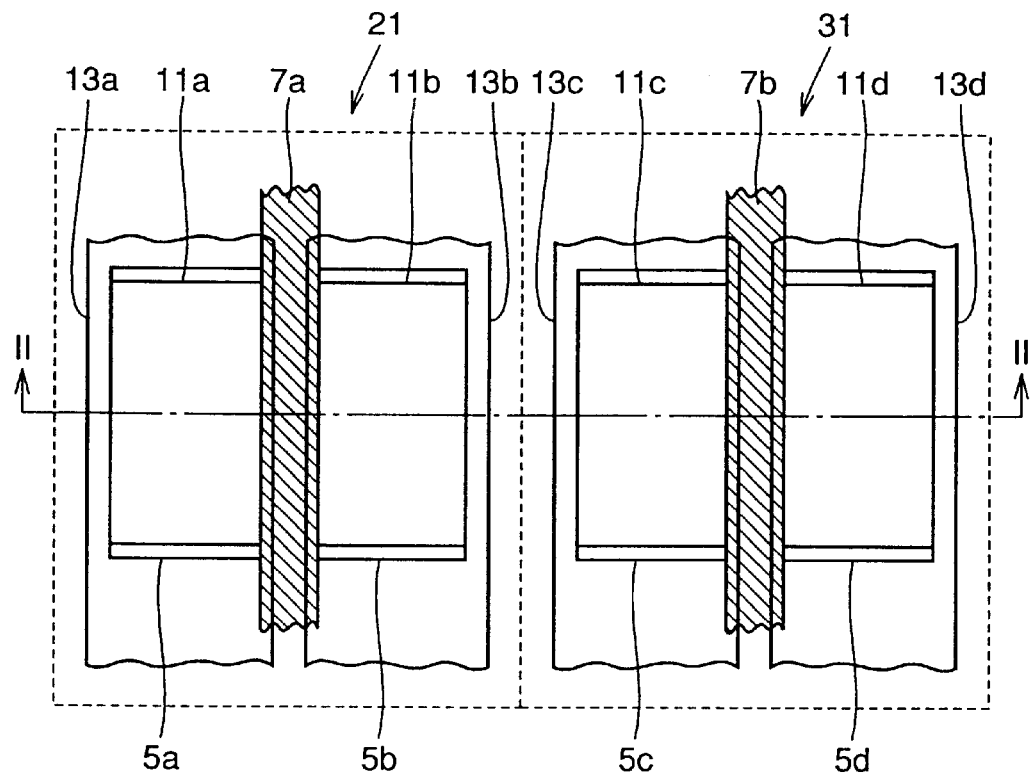
FIG. 1 is a plan view of a semiconductor device according to a first embodiment of the present invention.

As shown in FIG. 1, in a semiconductor device according to the first embodiment of the present invention, n-type impurity regions 5a, 5b, 5c, and 5d are formed on a silicon substrate. Each of impurity regions 5a, 5b, 5c, and 5d has a low concentration impurity region and a high concentration impurity region.

A gate electrode 7a is formed extending in one direction between impurity region 5a and impurity region 5b. A gate electrode 7b is formed extending in one direction between impurity region 5c and impurity region 5d.

A transistor 21 is formed by gate electrode 7a and impurity regions 5a and 5b serving as source/drain regions. A transistor 31 is formed by gate electrode 7b and impurity regions 5c and 5d serving as source/drain regions.

Transistors 21 and 31 are covered by an interlayer insulating film. Contact holes 11a, 11b, 11c, and 11d reaching impurity regions 5a, 5b, 5c, and 5d are formed in the interlayer insulating film. The area of each of the contact holes 11a, 11b, 11c, and 11d is slightly smaller than the area of the respective one of impurity regions 5a, 5b, 5c and 5d.

Plug layers are formed filling contact holes 11a, 11b, 11c, and 11d. Interconnection layers 13a, 13b, 13c, and 13d are formed on the plug layers. These interconnection layers 13a, 13b, 13c, and 13d are formed extending in one direction.

Figure 2:
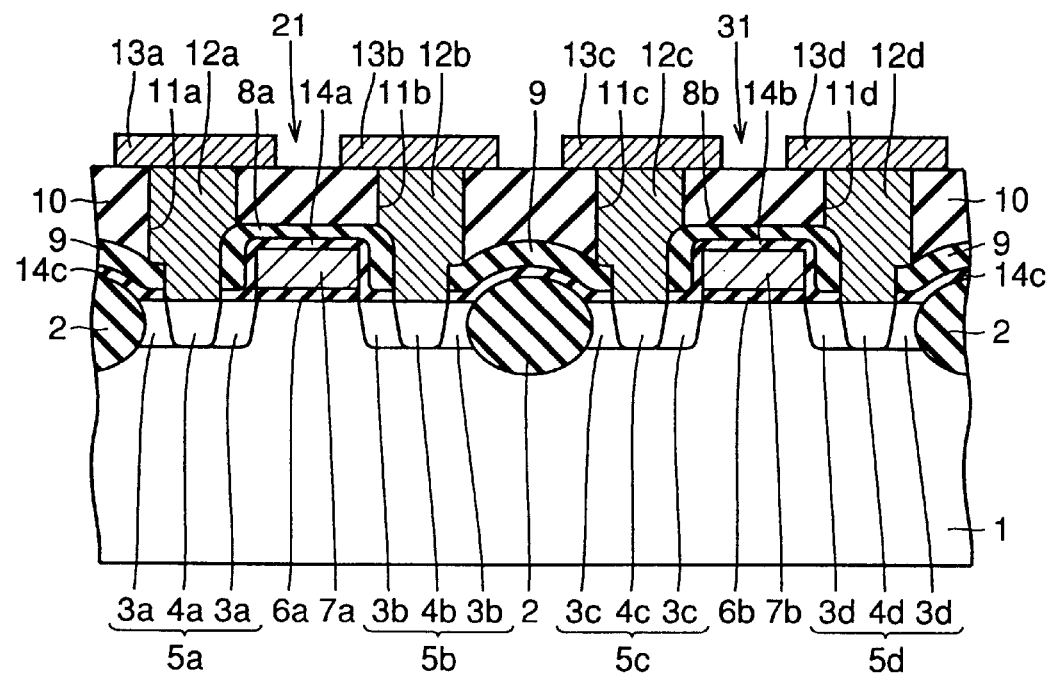
FIG. 2 is a diagram representing a cross section taken along the line II—II in FIG. 1.

As shown in FIG. 2, isolating oxide films 2 are formed spaced apart from one another on a surface of a p-type silicon substrate 1. An active region is formed between the respective isolating oxide films 2, and impurity regions 5a, 5b, 5c, and 5d serving as conductive regions are formed within the active region.

Impurity regions 5a, 5b, 5c, and 5d are respectively formed by low concentration impurity regions 3a, 3b, 3c, and 3d having a relatively low n-type impurity concentration and high concentration impurity regions 4a, 4b, 4c, and 4d having a relatively high n-type impurity concentration.

High concentration impurity regions 4a, 4b, 4c, and 4d are formed within low concentration impurity regions 3a, 3b, 3c, and 3d. Each of impurity regions 5a, 5b, 5c, and 5d has the so-called LDD (Lightly Doped Drain) structure.

Between a pair of impurity regions 5a and 5b formed spaced apart from one another, gate electrode 7a is formed with a gate oxide film 6a serving as a gate insulating film interposed between gate electrode 7a and substrate 1. Between a pair of impurity regions 5c and 5d formed spaced apart from one another, gate electrode 7b is formed with a gate oxide film 6b serving as a gate insulating film interposed between gate electrode 7b and substrate 1.

Gate electrodes 7a and 7b are respectively formed by impurity-doped polysilicon. Gate electrodes 7a and 7b may be formed to have a two-layer structure of doped polysilicon and silicide.

A silicon oxide film 14a is formed covering gate electrode 7a, a silicon oxide film 14b is formed covering gate electrode 7b, and a silicon oxide film 14c is formed covering an isolating oxide film 2. Silicon oxide films 14a, 14b, and 14c are substantially equal in thickness.

An etching stopper 8a is provided on silicon oxide film 14a, an etching stopper 8b is provided on silicon oxide film 14b, and an etching stopper 9 is provided on silicon oxide film 14c. Etching stoppers 8a and 8b serving as protective films covering gate electrodes are formed by a silicon nitride film (SiN) or a silicon oxynitride film (SiON). Etching stoppers 8a and 8b may be formed to have a thickness of about 40 nm to 50 nm.

A field-effect transistor 21 is formed by impurity regions 5a and 5b and gate electrode 7a, and a field-effect transistor 31 is formed by impurity regions 5c and 5d and gate electrode 7b.

An interlayer insulating film 10 is formed covering etching stoppers 8a, 8b, and 9. Interlayer insulating film 10 is formed by a silicon oxide film. Contact holes 11a, 11b, 11c, and 11d are formed in interlayer insulating film 10 as holes reaching impurity regions 5a, 5b, 5c, and 5d.

Plug layers 112a, 12b, 12c, and 12d made of tungsten and electrically connected to impurity regions 5a, 5b, 5c, and 5d are provided within contact holes 11a, 11b, 11c, and 11d, respectively.

A surface of interlayer insulating film 10 is substantially flush with the surfaces of plug layers 12a, 12b, 12c, and 12d. Interconnection layers 13a, 13b, 13c, and 13d are formed on interlayer insulating film 10 such that they make contact with and are electrically connected to plug layers 12a, 12b, 12c, and 12d.

Each of interconnection layers 13a, 13b, 13c, and 13d is formed by an aluminum alloy containing copper. Plug layers 12a, 12b, 12c, and 12d and interconnection layers 13a, 13b, 13c, and 13d form conductive layers. Titanium nitride layers or titanium layers may be provided as barrier layers between interconnection layers 13a, 13b, 13c, and 13d and plug layers 12a, 12b, 12c, and 12d.

Now, a method of manufacturing the semiconductor device shown in FIG. 2 will be described.

Figure 3:
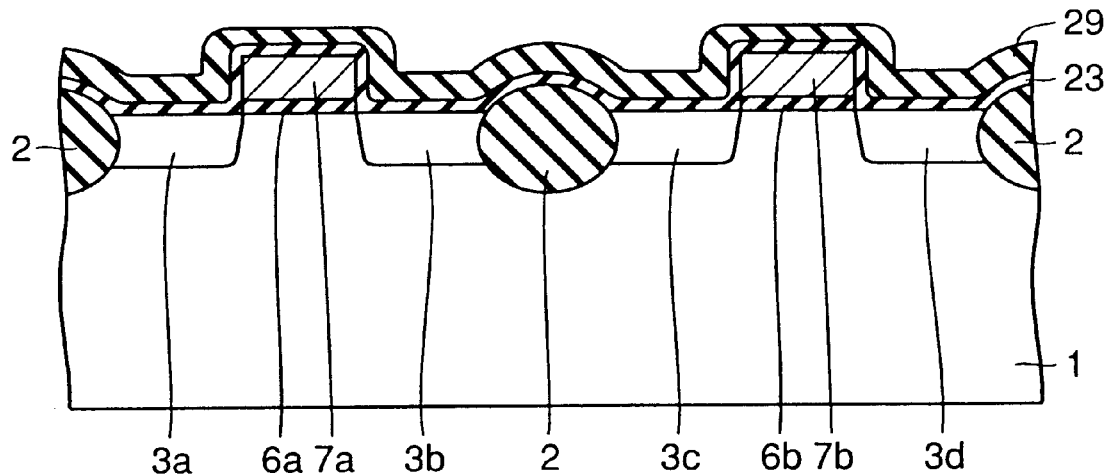
FIGS. 3 to 6 are cross sectional views representing the first to fourth steps of a method of manufacturing the semiconductor device shown in FIG. 2.

As shown in FIG. 3, an isolating oxide film 2 is formed by partially oxidizing the surface of a semiconductor substrate 1. A silicon oxide film and doped polysilicon are deposited on the surface of semiconductor substrate 1, and are patterned into a prescribed shape to form gate oxide films 6a and 6b and gate electrodes 7a and 7b.

Arsenic, which is an N-type impurity, is implanted into a silicon substrate 1 using gate electrodes 7a and 7b as masks to form low concentration impurity regions 3a, 3b, 3c, and 3d. A silicon oxide film 23 having a thickness of about 30 nm to 40 nm is deposited by the CVD (Chemical Vapor Deposition) method to cover gate electrodes 7a and 7b and isolating oxide film 2. A silicon nitride film 29 having a thickness of about 40 nm to 50 nm is deposited on silicon oxide film 23 by the CVD method.

Figure 4:
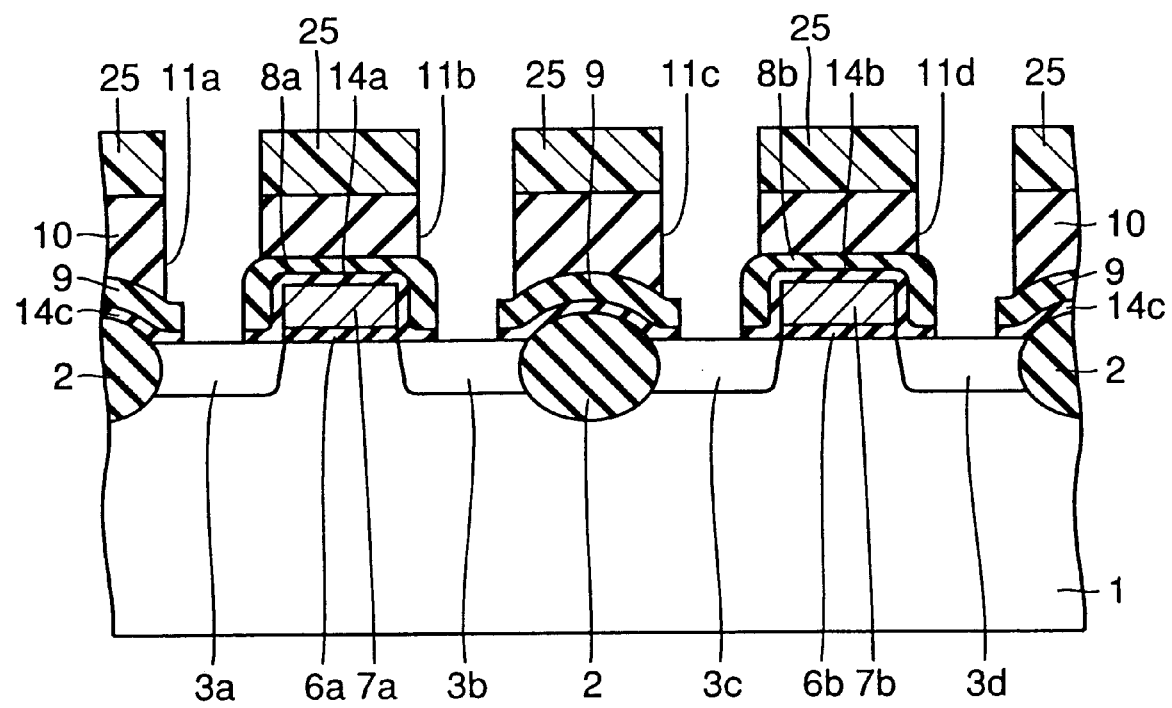

As shown in FIG. 4, a silicon oxide film 10 is deposited on silicon nitride film 29 by the CVD method and is heat-treated to achieve planarization. Then, a resist is applied on silicon oxide film 10, and the resist is patterned into a prescribed shape to form a resist pattern 25.

According to resist pattern 25, an interlayer insulating film 10 formed by the silicon oxide film is etched with the condition that the etching rate of the silicon oxide film is greater than that of the silicon nitride film. In this manner, silicon nitride film 29 serving as a protective film and an etching stopper is exposed.

Then, silicon nitride film 29 and silicon oxide film 23 are etched with the condition that the etching rate of the silicon nitride film is greater than that of the silicon oxide film. Thus, contact holes 11a, 11b, 11c, and 11d are formed. Silicon oxide films 14a, 14b, and 14c and etching stoppers 8a, 8b, and 9 are formed at the same time.

Figure 5:
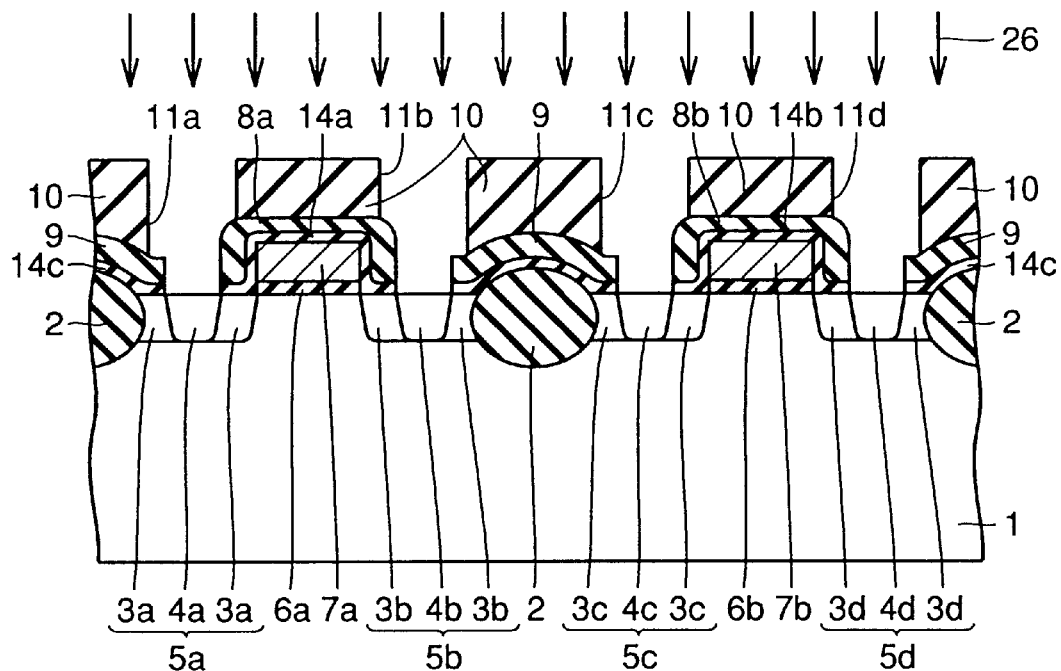

As shown in FIG. 5, arsenic ions are implanted from the direction shown by an arrow 26 into silicon substrate 1 via contact holes 11a, 11b, 11c, and 11d using interlayer insulating film 10 as a mask, thereby forming high concentration impurity regions 4a, 4b, 4c, and 4d. The impurity concentration of high concentration impurity regions 4a, 4b, 4c, and 4d is higher than that of low concentration impurity regions 3a, 3b, 3c, and 3d.

Figure 6:
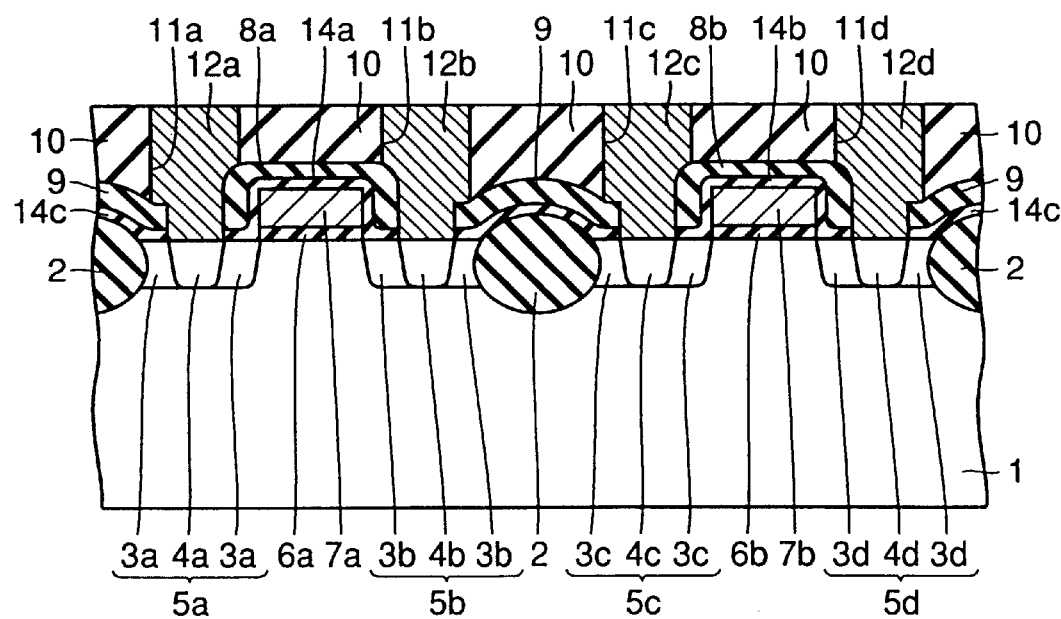

As shown in FIG. 6, a tungsten film is formed by the CVD (Chemical Vapor Deposition) method filling each of the contact holes 11a, 11b, 11c, and 11d and covering interlayer insulating film 10. The tungsten film is etched back on its entire surface, leaving tungsten within each of the contact holes 11a, 11b, 11c, and 11d to form plug layers 12a, 12b, 12c, and 12d.

As shown in FIG. 2, an aluminum film serving as a conductive material is deposited by sputtering on interlayer insulating film 10 such that the aluminum film makes contact with plug layers 12a, 12b, 12c, and 12d. The aluminum film is patterned into a prescribed shape to form interconnection layers 13a, 13b, 13c, and 13d. Interconnection layers 13a, 13b, 13c, and 13d and plug layers 12a, 12b, 12c, and 12d form conductive layers. Thus, the semiconductor device shown in FIG. 2 is completed.

In such a semiconductor device, an impurity is implanted through contact holes 11a, 11b, 11c, and 11d to form high concentration impurity regions 4a, 4b, 4c, and 4d so that the respective bottoms of contact holes 11a, 11b, 11c, and 11d are always formed by high concentration impurity regions 4a, 4b, 4c, and 4d. In other words, a high concentration impurity region has a region that contacts the plug layer and that is substantially the same in size as a contact hole. Since plug layers 12a, 12b, 12c, and 12d are formed making contact with these high concentration impurity regions 4a, 4b, 4c, and 4d, the increase in the contact resistances between high concentration impurity regions 4a, 4b, 4c, and 4d and plug layers 12a, 12b, 12c, and 12d can be prevented. As a result, transistors 21 and 31 can be operated at a high speed.

In addition, when manufacturing the usual LDD structure, first, a low concentration impurity region and a high concentration impurity region are formed, and thereafter, an interlayer insulating film covering these regions is formed. In this case, since an impurity in the high concentration impurity region can easily be diffused during the heat treatment to planarize the interlayer insulating film, the threshold value of a transistor may vary, or at worst, a pair of impurity regions may be connected with one another, resulting in the problem of the generation of a leakage current.

According to the present invention, however, first, low concentration impurity regions 3a, 3b, 3c, and 3d are formed, and thereafter, an interlayer insulating film 10 is formed before high concentration impurity regions 4a, 4b, 4c, and 4d are formed. Thus, during the heat treatment of interlayer insulating film 10, high concentration impurity regions 4a, 4b, 4c, and 4d do not exist. Consequently, the diffusion of the impurity from the high concentration impurity region does not occur during the heat treatment so that the above problem does not arise.

Moreover, etching stoppers 8a and 8b made of a silicon nitride film are formed covering gate electrodes 7a and 7b. Contact holes 11a, 11b, 11c, 11d are formed by utilizing these etching stoppers 8a and 8b so that contact holes 11a, 11b, 11c, and 11d are less likely to come into contact with gate electrodes 7a and 7b even when contact holes 11a, 11b, 11c, and 11d become larger in width. As a result, even when transistors 21 and 31 are miniaturized, relatively large contact holes 11a, 11b, 11c, and 11d can be formed.

Furthermore, since plug layers 12a, 12b, 12c, and 12d are formed by etching back the entire surface of the tungsten film, plug layers 12a, 12b, 12c, and 12d can positively fill contact holes 11a, 11b, 11c, and 11d. Thus, contact failure between plug layers 12a, 12b, 12c, and 12d and high concentration impurity regions 4a, 4b, 4c and 4d can be prevented, and a highly reliable semiconductor device can be provided.

Second Embodiment

Figure 7:
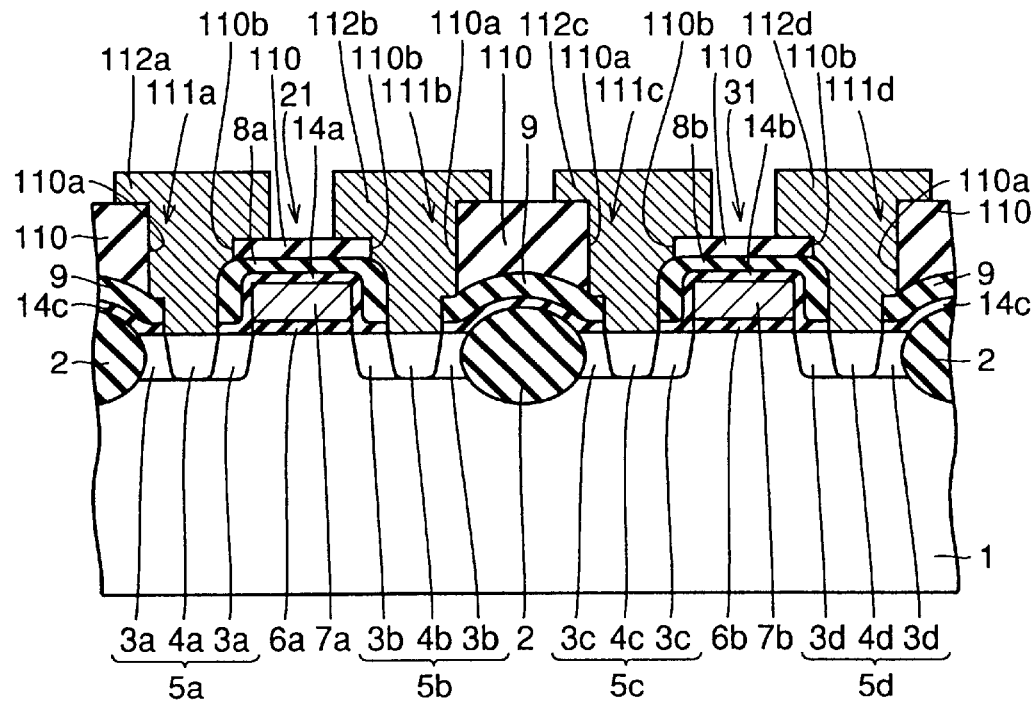
FIG. 7 is a cross sectional view of a semiconductor device according to a second embodiment of the present invention.

The semiconductor device according to the second embodiment of the present invention shown in FIG. 7 differs from the semiconductor device shown in FIG. 2 in that the shape of an interlayer insulating film 110 is different from the shape of interlayer insulating film 10 in FIG. 2. Moreover, the shapes of interconnection layers 112a, 112b, 112c and 112d are different from those of interconnection layers 13a, 13b, 13c, and 13d in FIG. 2.

As shown in FIG. 7, interlayer insulating film 110 is formed by a silicon oxide film. Interlayer insulating film 110 is relatively thick above isolating oxide film 2, and is relatively thin above gate electrodes 7a and 7b.

In interlayer insulating film 110, contact holes 111a, 111b, 111c, and 111d are formed as holes reaching high concentration impurity regions 4a, 4b, 4c, and 4d. Contact holes 111a, 111b, 111c, and 111d are defined by the respective opposing sidewalls 110a and 110b. A sidewall 110a is relatively high, while a sidewall 110b is relatively low in height. The respective sidewalls 110b above gate electrodes 7a and 7b are relatively low in height.

Interconnection layers 112a, 112b, 112c, and 112d serving as conductive layers are formed filling these contact holes 111a, 111b, 111c, and 111d and establishing an electrical connection to high concentration impurity regions 4a, 4b, 4c, and 4d. The respective interconnection layers 112a, 112b, 112c, and 112d are formed on interlayer insulating film 110. Therefore, while interconnection layers 112a, 112b, 112c, and 112d have substantially the same thickness as those in a conventional example in portions where interlayer insulating film 110 below is thick, interconnection layers 112a, 112b, 112c, and 112d in portions where interlayer insulating film 110 below is thin are greater in thickness than those in a conventional semiconductor device. Interconnection layers 112a, 112b, 112c, and 112d are respectively formed by an aluminum alloy containing copper.

Figure 8:
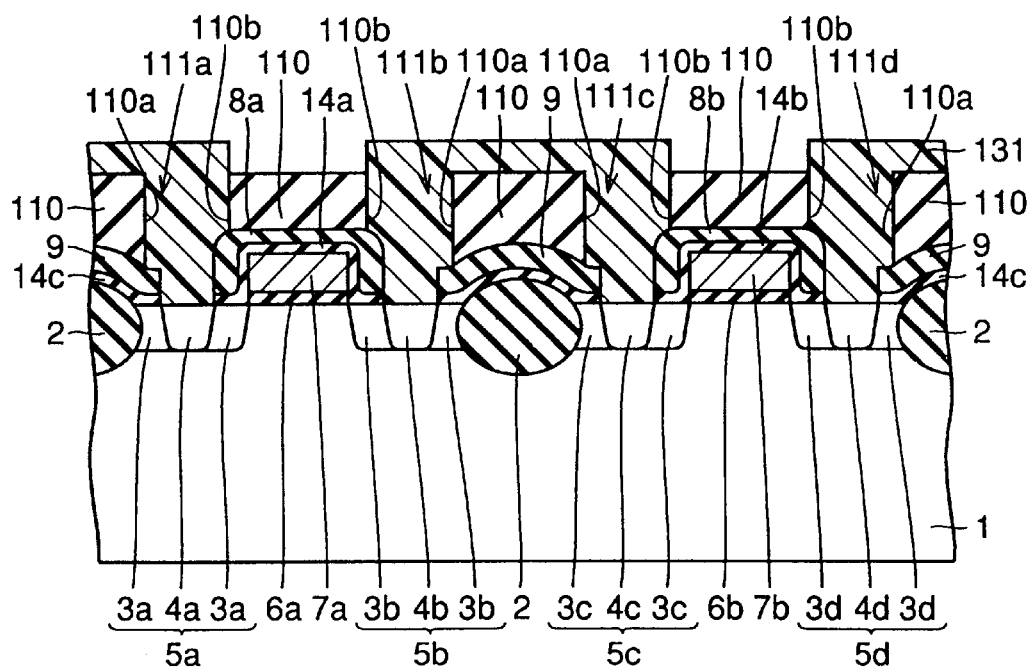
FIGS. 8 to 10 are cross sectional views representing the first to third steps of a method of manufacturing the semiconductor device shown in FIG. 7.

Now, a method of manufacturing the semiconductor device shown in FIG. 7 will be described. As shown in FIG. 8, in a manner similar to the method of FIG. 3 of the first embodiment, an isolating oxide film 2, gate oxide films 6a and 6b, gate electrodes 7a and 7b, low concentration impurity regions 3a, 3b, 3c, and 3d, a silicon oxide film 23, and a silicon nitride film 29 are formed on a silicon substrate 1.

An interlayer insulating film 110 made of a silicon oxide film is formed on silicon nitride film 29. A resist pattern is formed on interlayer insulating film 110. By using the resist pattern as a mask, interlayer insulating film 110 is etched with the condition that the etching rate of the silicon oxide film is greater than that of the silicon nitride film to expose silicon nitride film 29.

Then, silicon nitride film 29 and silicon oxide film 23 are etched with the condition that the etching rate of the silicon nitride film is greater than that of the silicon oxide film. Thus, contact holes 111a, 111b, 111c, and 111d are formed. Contact holes 111a, 111b, 111c, and 111d are defined by a pair of sidewalls 110a and 110b opposing one another. At the same time, silicon oxide films 14a, 14b, and 14c and etching stoppers 8a, 8b, and 9 are formed.

An impurity is implanted into silicon substrate 1 through contact holes 111a, 111b, 111c, and 111d to form high concentration impurity regions 4a, 4b, 4c, and 4d.

A resist is applied to cover interlayer insulating film 110. The resist is patterned such that a resist pattern 131 is formed that covers contact holes 111a, 111b, 111c, and 111d, and interlayer insulating film 110 above isolating oxide film 2. Resist pattern 131 covers one of the opposing sidewalls, sidewall 110a.

Figure 9:
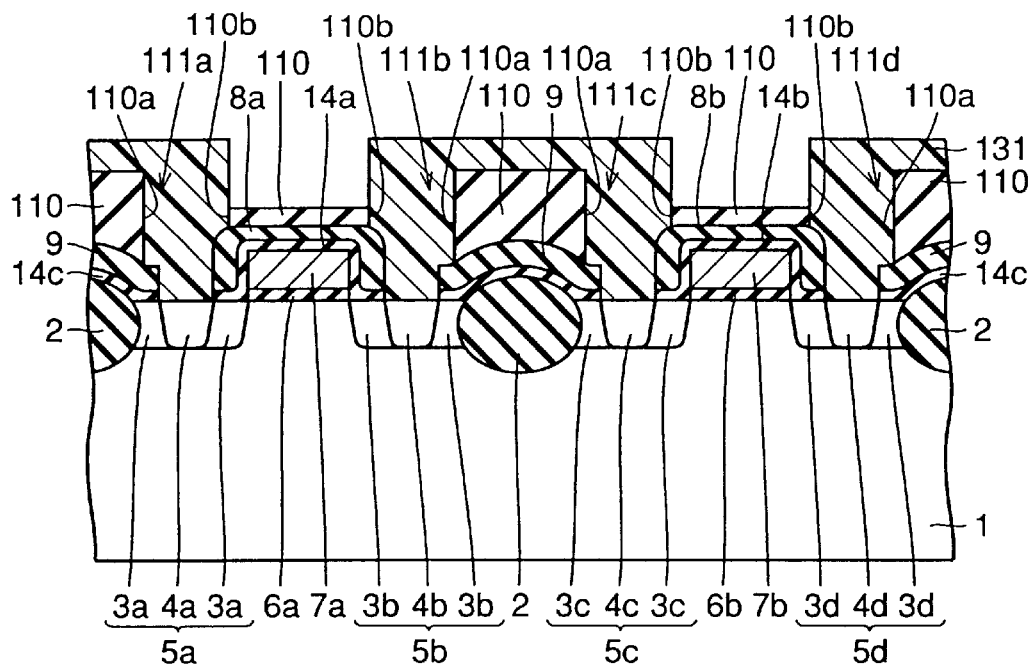

As shown in FIG. 9, interlayer insulating film 110 is etched using a gas that facilitates etching of a silicon oxide film, such as $CF_4$, $CHF_3$, and $C_4F_8$. Thus, one of the respective sidewalls of contact holes 111a, 111b, 111c, and 111d is reduced in height to form a relatively low sidewall 110b. Each sidewall 110b is formed for interlayer insulating film 110 above gate electrodes 7a and 7b.

Figure 10:
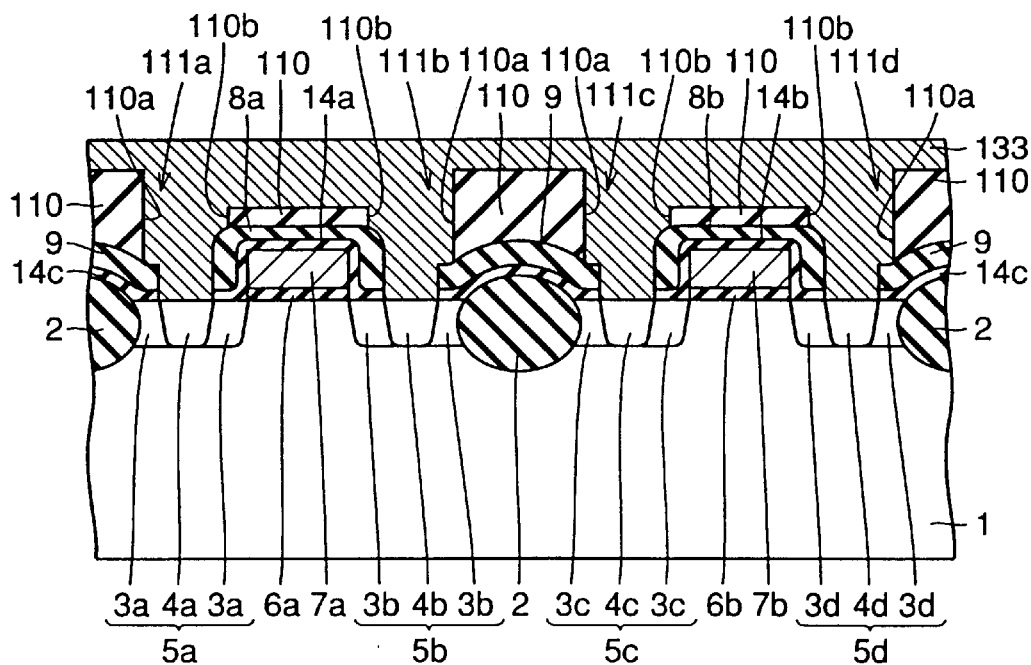

As shown in FIG. 10, an aluminum film 133 as a conductive material is formed by sputtering on interlayer insulating film 110, filling contact holes 111a, 111b, 111c, and 111d.

As shown in FIG. 7, a resist is applied on aluminum film 133. The resist is patterned into a prescribed shape to form a resist pattern. By etching aluminum film 133 according to the resist pattern, interconnection layers 112a, 112b, 112c, and 112d are formed. Thus, the semiconductor device shown in FIG. 7 is completed.

Such a semiconductor device produces the same effect as the semiconductor device according to the first embodiment.

Moreover, interlayer insulating film 110 is made thinner above gate electrodes 7a and 7b. Accordingly, one of the respective sidewalls defining contact holes 111a, 111b, 111c, and 111d becomes a relatively low sidewall 110b. Thus, interconnection layers 112a, 112b, 112c, and 112d become greater in thickness above sidewall 110b than those in a conventional example. As a result, the cross sectional areas of interconnection layers 112a, 112b, 112c, and 112d are increased, while the electric resistance decreases, thereby achieving a higher speed operation than is possible with a conventional semiconductor device.

Third Embodiment

Figure 11:
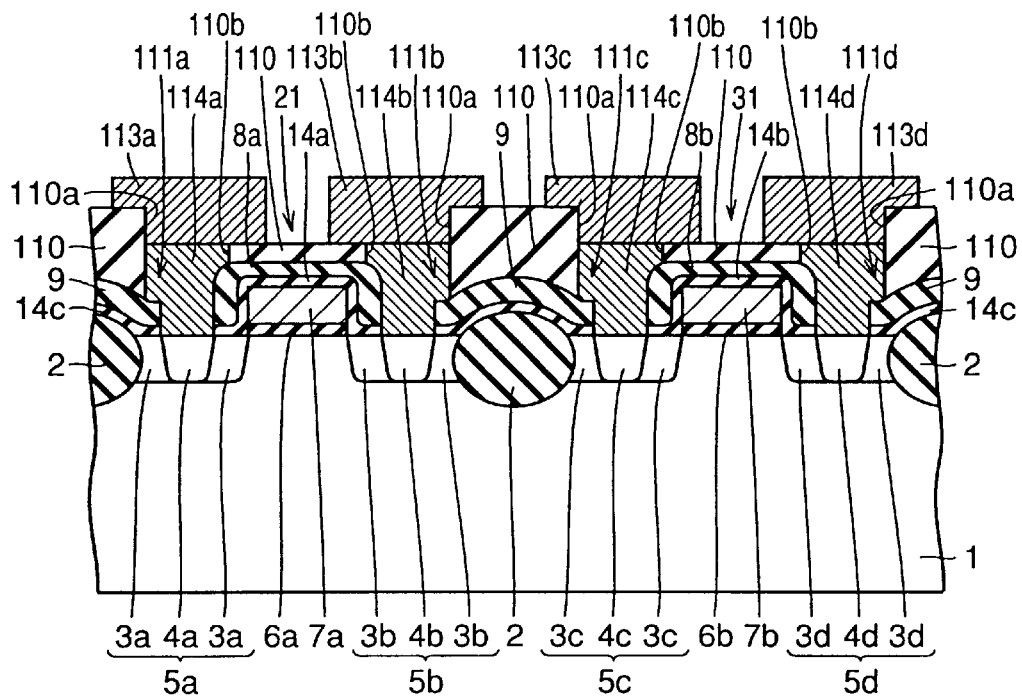
FIG. 11 is a cross sectional view of a semiconductor device according to a third embodiment of the present invention.

The semiconductor device according to the third embodiment of the present invention shown in FIG. 11 differs from the semiconductor device shown in FIG. 7 in that a conductive layer has a plug structure. More specifically, the conductive layers are formed by plug layers 114a, 114b, 114c, and 114d filling contact holes 111a, 111b, 111c, and 111d and interconnection layers 113a, 113b, 113c, and 113d formed on the plug layers.

Figure 12:
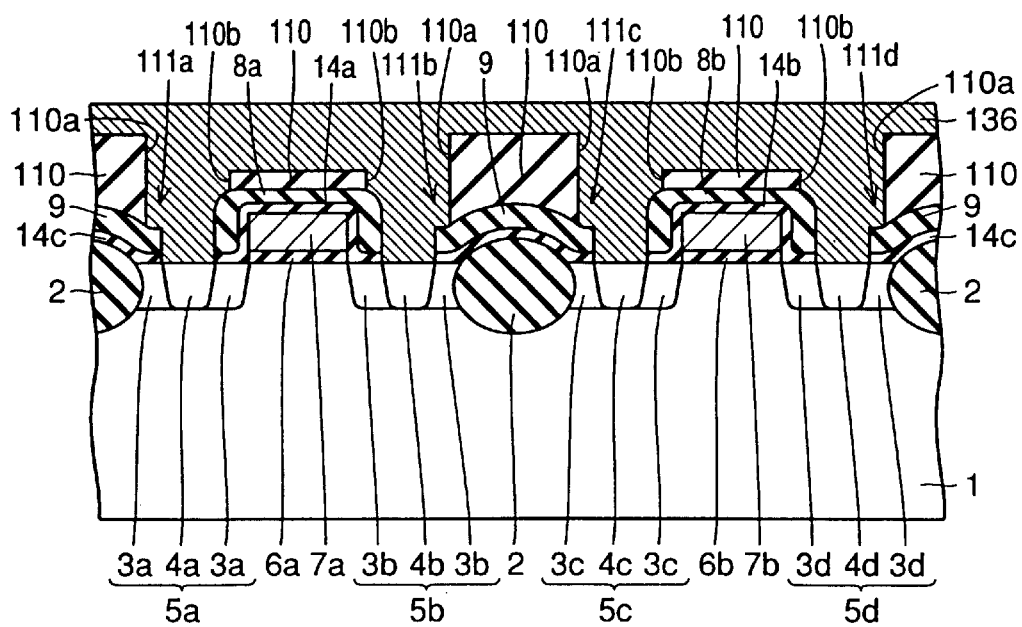
FIGS. 12 and 13 are cross sectional views representing the first and second steps of a method of manufacturing the semiconductor device shown in FIG. 11.

Now, a method of manufacturing the semiconductor device shown in FIG. 11 will be described. As shown in FIG. 12, in a manner similar to the method of the second embodiment, an isolating oxide film 2, gate oxide films 6a and 6b, gate electrodes 7a and 7b, low concentration impurity regions 3a, 3b, 3c, and 3d, silicon oxide films 14a, 14b, and 14c, etching stoppers 8a, 8b and 9, an interlayer insulating film 110, contact holes 111a, 111b, 111c, and 111d, and high concentration impurity regions 4a, 4b, 4c, and 4d are formed on a silicon substrate 1.

Then, according to the steps shown in FIGS. 8 and 9 of the second embodiment, interlayer insulating film 110 above gate electrodes 7a and 7b is etched to form a relatively low sidewall 110b.

As shown in FIG. 12, a tungsten film 136 as a conductive material covering interlayer insulating film 110 is formed filling contact holes 111a, 111b, 111c, and 111d.

Figure 13:
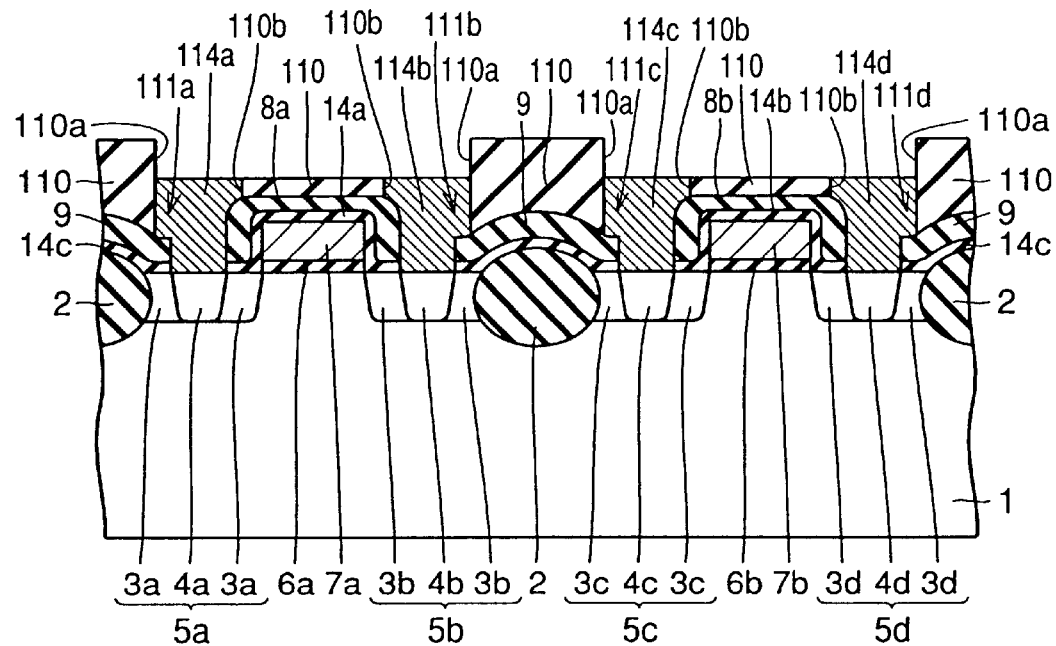

As shown in FIG. 13, the entire surface of tungsten film 136 is etched back with the condition that the etching rate of the silicon oxide film is greater than that of tungsten. Thus, tungsten that remains within contact holes 111a, 111b, 111c and 111d forms plug layers 114a, 114b, 114c, and 114d.

As shown in FIG. 11, an aluminum film is formed by sputtering, covering interlayer insulating film 110 and making contact with plug layers 114a, 114b, 114c, and 114d. A resist is applied on the aluminum film, and the resist is patterned into a prescribed shape to form a resist pattern. According to this resist pattern, the aluminum film is etched to form interconnection layers 113a, 113b, 113c, and 113d. Thus, the semiconductor device shown in FIG. 11 is completed.

Such a semiconductor device produces the same effect as the semiconductor device according to the second embodiment shown in FIG. 7.

In addition, conductive layers include plug layers 114a, 114b, 114c, and 114d. Since plug layers 114a, 114b, 114c, and 114d are formed from tungsten that can easily fill contact holes 111a, 111b, 111c, and 111d, contact holes 111a, 111b, 111c, and 111d are positively filled with tungsten. Therefore, plug layers 114a, 114b, 114c, and 114d positively make contact with high concentration impurity regions 4a, 4b, 4c and 4d so that the contact resistance is reduced. As a result, a highly reliable semiconductor device without contact failure can be provided.

Furthermore, since plug layers 114a, 114b, 114c, and 114d are formed by etching back the entire surface of tungsten film 136, the tungsten within contact holes 111a, 111b, 111c, and 111d are not over-etched. Therefore, the amount of tungsten within contact holes 111a, 111b, 111c, and 111d is not reduced, and a high-speed operation of the semiconductor device becomes possible.

Fourth Embodiment

Figure 14:
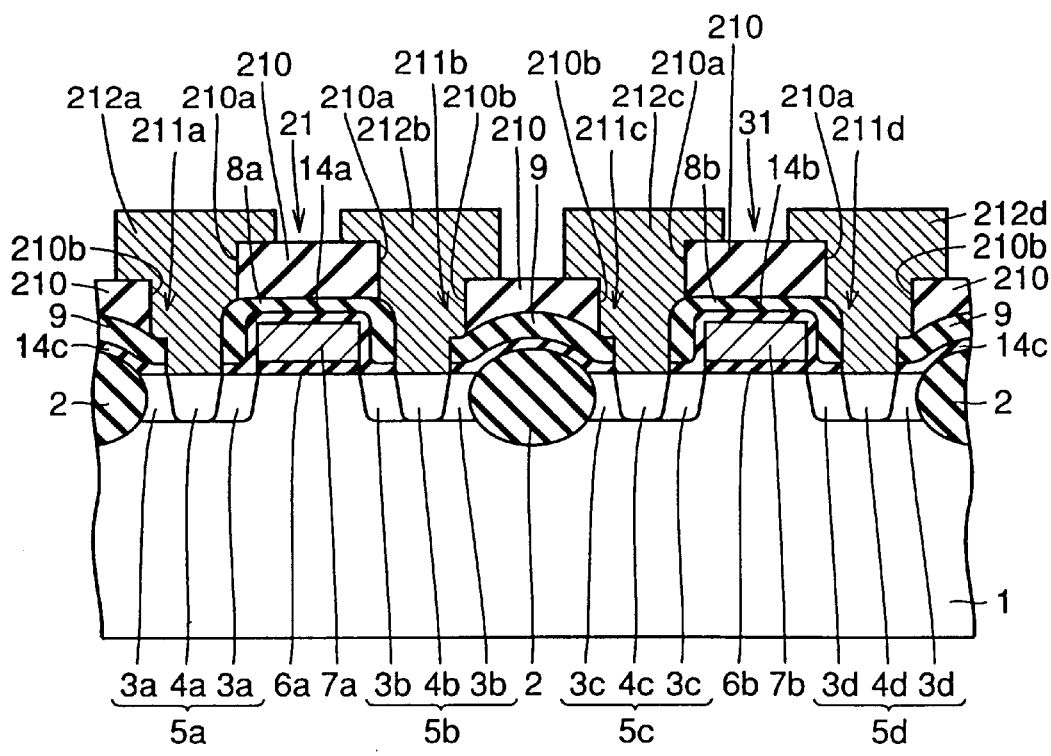
FIG. 14 is a cross sectional view of a semiconductor device according to a fourth embodiment of the present invention.

As shown in FIG. 14, the semiconductor device according to the fourth embodiment of the present invention differs from the semiconductor device according to the second embodiment shown in FIG. 7 in that an interlayer insulating film 210 in the regions above gate electrodes 7a and 7b is thick while the interlayer insulating film in the region above isolating oxide film 2 is relatively thin.

In interlayer insulating film 210, contact holes 211a, 211b, 211c, and 211d reaching high concentration impurity regions 4a, 4b, 4c, and 4d are formed. Each of the contact holes 211a, 211b, 211c, and 211d is defined by a relatively high sidewall 210a and a relatively low sidewall 210b. A high sidewall 210a is formed for interlayer insulating film 210 above gate electrodes 7a and 7b.

Interconnection layers 212a, 212b, 212c, and 212d are formed filling contact holes 211a, 211b, 211c, and 211d and on interlayer insulating film 210. Interconnection layers 212a, 212b, 212c, and 212d are made of an aluminum alloy containing copper. Interconnection layers 212a, 212b, 212c, and 212d are substantially the same in thickness as those in a conventional example above gate electrodes 7a and 7b, but are greater in thickness than those in the conventional example above isolating oxide film 2.

Figure 15:
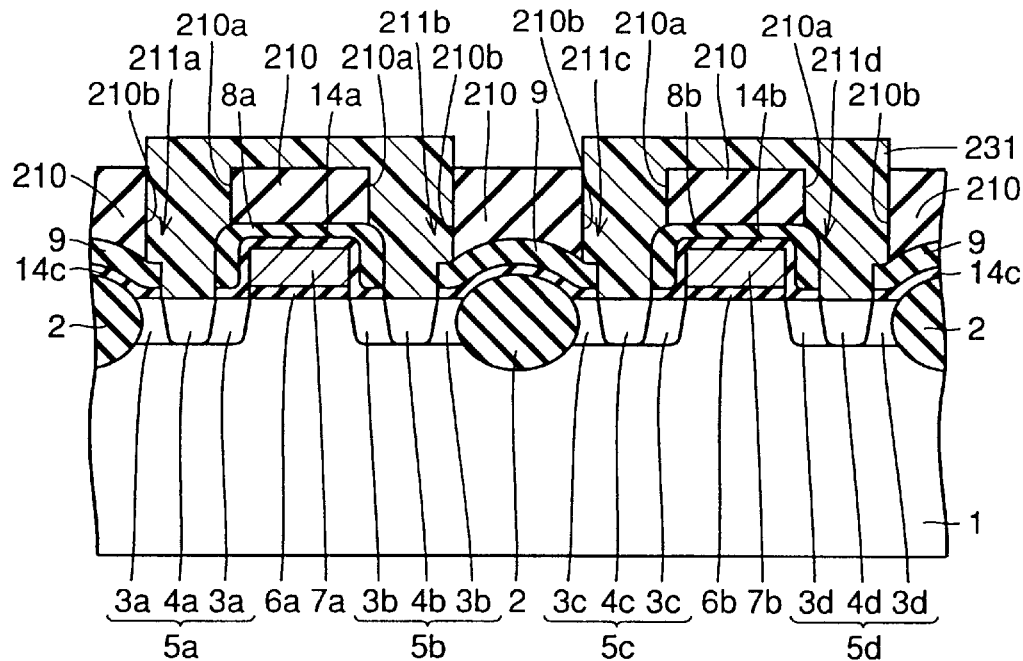
FIGS. 15 to 17 are cross sectional views representing the first to third steps of a method of manufacturing the semiconductor device shown in FIG. 14.

Now, a method of manufacturing the semiconductor device shown in FIG. 14 will be described. As shown in FIG. 15, in a manner similar to the steps shown in FIG. 3 of the first embodiment, an isolating oxide film 2, gate oxide films 6a and 6b, gate electrodes 7a and 7b, low concentration impurity regions 3a, 3b, 3c, and 3d, a silicon oxide film 23, and a silicon nitride film 29 are formed on a silicon substrate 1.

An interlayer insulating film 210 made of a silicon oxide film is formed to cover silicon substrate 1. A resist is applied on interlayer insulating film 210, and is patterned into a prescribed shape to form a resist pattern. According to this resist pattern, interlayer insulating film 210 is etched with the condition that the etching rate of the silicon oxide film is greater than that of the silicon nitride film to expose silicon nitride film 29.

Then, silicon nitride film 29 and silicon oxide film 23 are etched with the condition that the etching rate of the silicon nitride film is greater than that of the silicon oxide film. Thus, contact holes 211a, 211b, 211c, and 211d are formed. Contact holes 211a, 211b, 211c, and 211d are each defined by a pair of sidewalls 210a and 210b opposing one another. At the same time, silicon oxide films 14a, 14b, and 14c, and etching stoppers 8a, 8b, and 9 are formed.

An impurity is implanted into silicon substrate 1 through contact holes 211a, 211b, 211c, and 211d to form high concentration impurity regions 4a, 4b, 4c, and 4d.

A resist is applied on interlayer insulating film 210, thus covering contact holes 211a, 211b, 211c, and 211d. The resist is patterned into a prescribed shape to form a resist pattern 231. Resist pattern 231 has a shape that covers contact holes 211a, 211b, 211c, and 211d, interlayer insulating film 210 above gate electrodes 7a and 7b, and the respective ones of the opposing sidewalls, sidewalls 210a.

Figure 16:
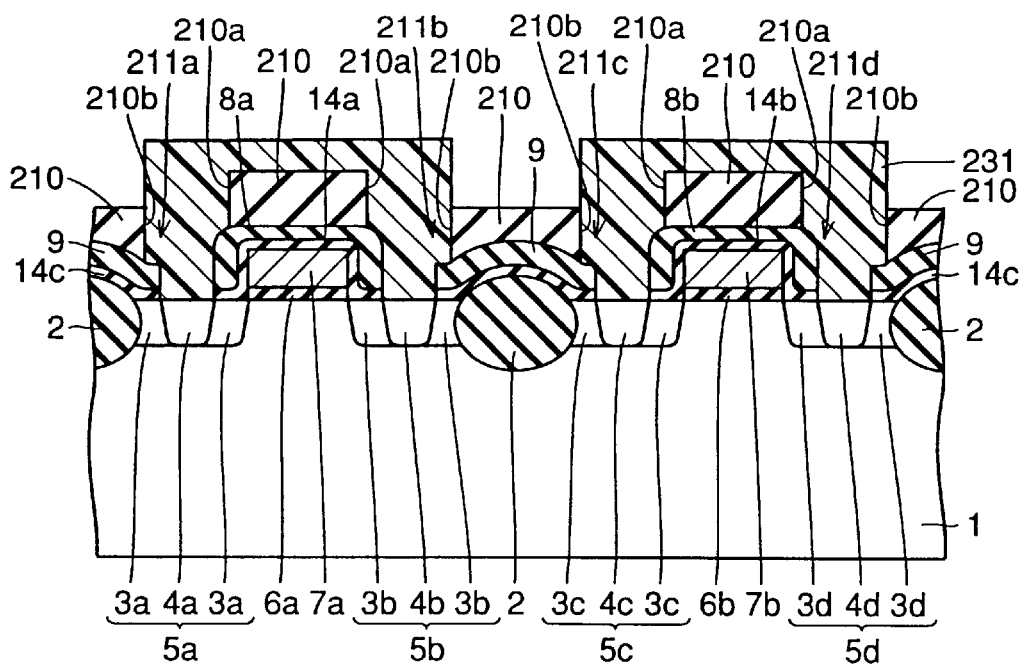

As shown in FIG. 16, interlayer insulating film 210 is etched using resist pattern 231 as a mask with a CF-type gas that facilitates etching of a silicon oxide film. Thus, interlayer insulating film 210 in a region above isolating oxide film 2 is reduced in thickness. In addition, a relatively low sidewall 210b is formed for interlayer insulating film 210 above isolating oxide film 2. Thus, the respective sidewalls 210a of interlayer insulating film 210 above gate electrodes 7a and 7b become relatively high.

Figure 17:
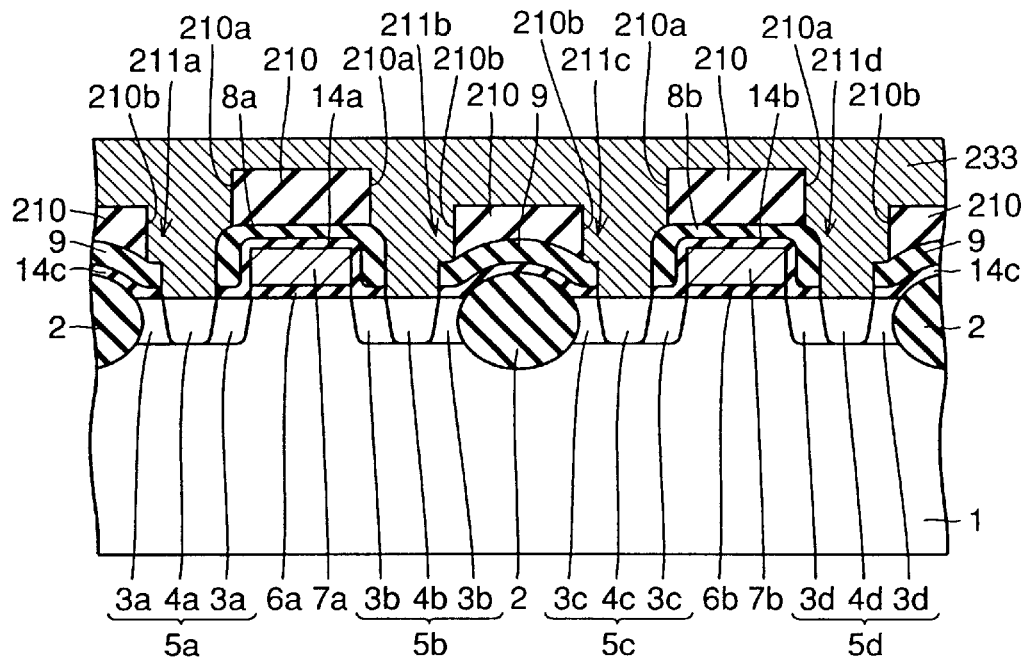

As shown in FIG. 17, an aluminum film 233 as a conductive material is formed by sputtering on interlayer insulating film 210, thus filling contact holes 211a, 211b, 211c, and 211d. Aluminum film 233 is relatively thin above gate electrodes 7a and 7b (substantially the same as in the conventional example), but is relatively thick above isolating oxide film 2.

As shown in FIG. 14, a resist is applied on aluminum film 233 and is patterned into a prescribed shape, whereby a resist pattern is formed. According to this resist pattern, aluminum film 233 is etched to form interconnection layers 212a, 212b, 212c, and 212d. Thus, the semiconductor device shown in FIG. 14 is completed.

Such a semiconductor device produces the same effect as the semiconductor device according to the second embodiment.

Fifth Embodiment

Figure 18:
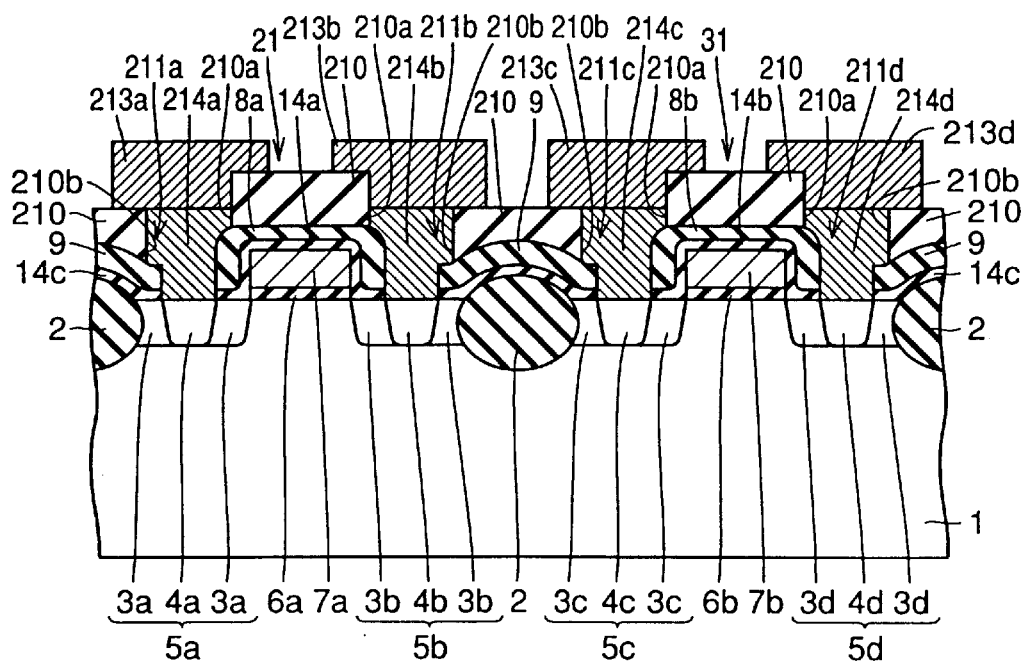
FIG. 18 is a cross sectional view of a semiconductor device according to a fifth embodiment of the present invention.

As shown in FIG. 18, the semiconductor device according to the fifth embodiment of the present invention differs from the semiconductor device according to the fourth embodiment shown in FIG. 14 in that a conductive layer is a structure having a plug layer. More specifically, the conductive layers are formed by plug layers 214a, 214b, 214c, and 214d and interconnection layers 213a, 213b, 213c, and 213d. Plug layers 214a, 214b, 214c, and 214d made of tungsten are formed filling contact holes 211a, 211b, 211c, and 211d and establishing an electrical connection to high concentration impurity regions 4a, 4b, 4c, and 4d. Interconnection layers 213a, 213b, 213c, and 213d made of an aluminum alloy are formed on interlayer insulating film 210 to make contact with the plug layers. Interconnection layers 213a, 213b, 213c, and 213d are relatively thin above gate electrodes 7a and 7b and are relatively thick above isolating oxide film 2.

Figure 19:
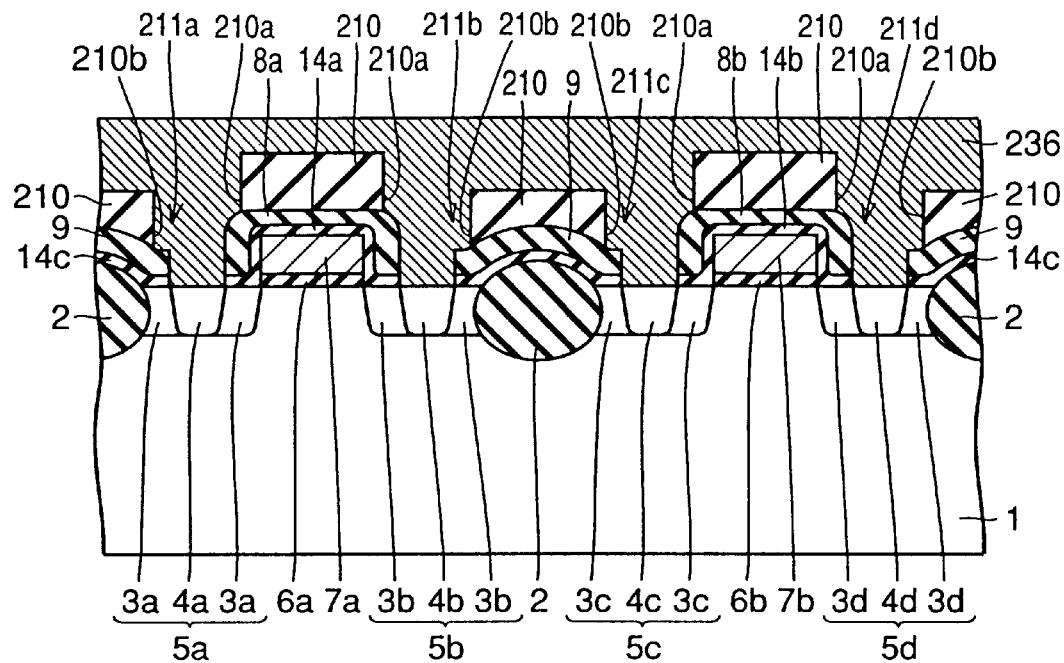
FIGS. 19 and 20 are cross sectional views representing the first and second steps of a method of manufacturing the semiconductor device shown in FIG. 18.

Now, a method of manufacturing the semiconductor device shown in FIG. 18 will be described. As shown in FIG. 19, in a manner similar to the steps shown in FIG. 16 of the fourth embodiment, an isolating oxide film 2, gate oxide films 6a and 6b, gate electrodes 7a and 7b, low concentration impurity regions 3a, 3b, 3c, and 3d are formed on a silicon substrate 1. On isolating oxide film 2 and gate electrodes 7a and 7b, silicon oxide films 14a, 14b, and 14c are formed, and thereafter, etching stopper films 8a, 8b, and 9 are formed thereon.

Interlayer insulating film 210 is formed on silicon substrate 1, and contact holes 211a, 211b, 211c, and 211d are formed in interlayer insulating film 210. An impurity is implanted into silicon substrate 1 through contact holes 211a, 211b, 211c, and 211d to form high concentration impurity regions 4a, 4b, 4c, and 4d.

Interlayer insulating film 210 above isolating oxide film 2 is etched to form a relatively low sidewall 210b. A tungsten film 236 as a conductive material is formed by the CVD method on interlayer insulating film 210, thus filling contact holes 211a, 211b, 211c, and 211d.

Figure 20:
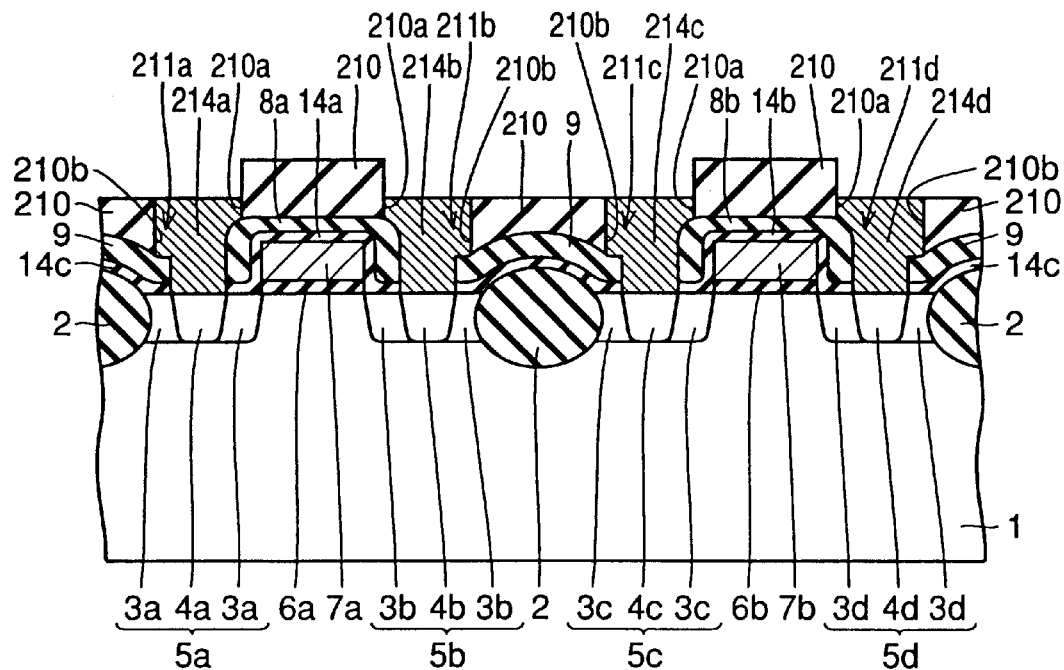

As shown in FIG. 20, the entire surface of tungsten film 236 is etched back to expose a surface of interlayer insulating film 210, while tungsten is left behind within contact holes 211a, 211b, 211c, and 211d forming plug layers 214a, 214b, 214c, and 214d.

Figure 21:
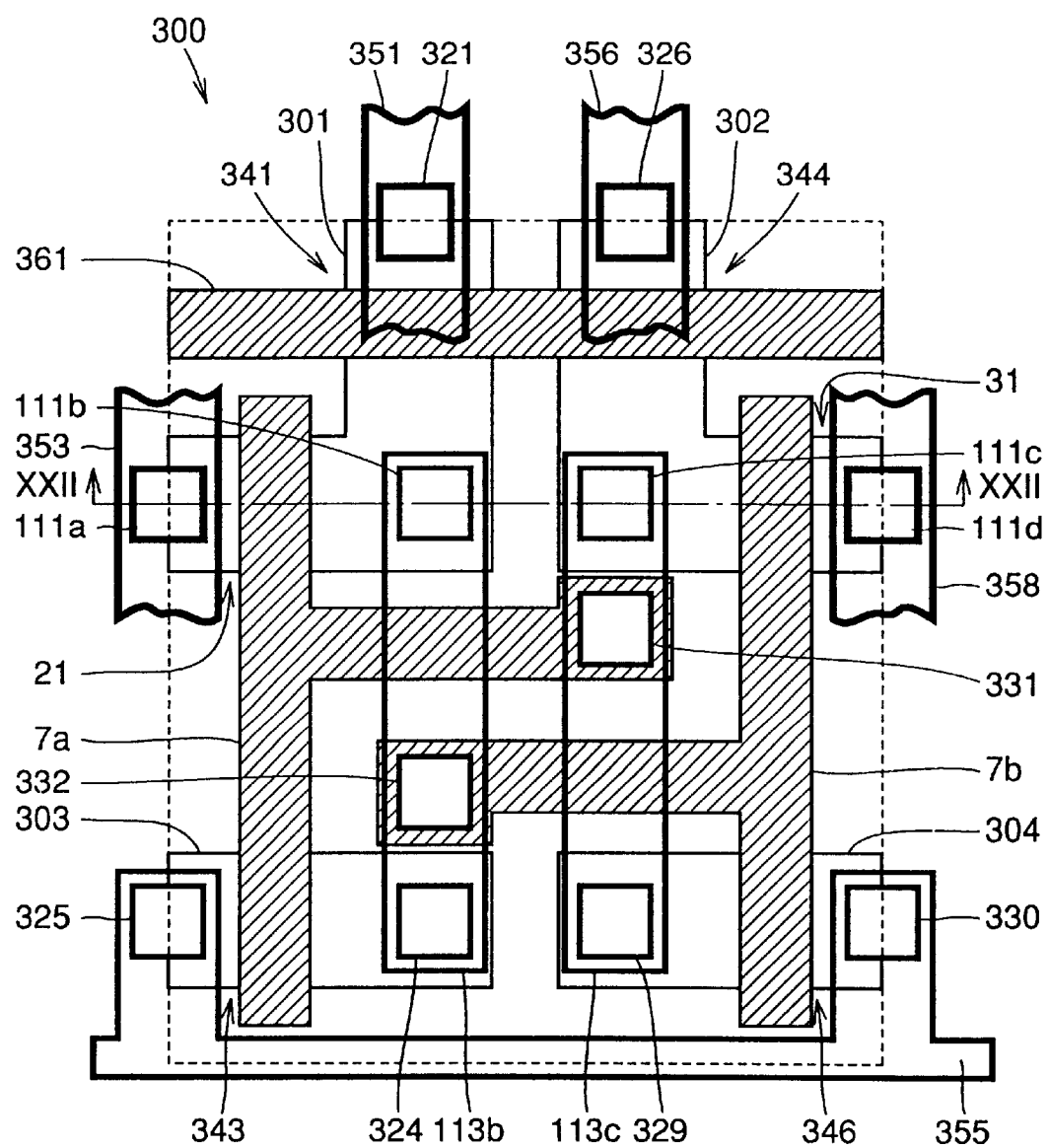
FIG. 21 is a plan view of a semiconductor device according to a sixth embodiment of the present invention.

As shown in FIG. 21, an aluminum film is deposited on interlayer insulating film 210 such that the aluminum film makes contact with plug layers 214a, 214b, 214c, and 214d. As shown in FIG. 18, a resist is applied on the aluminum film and is patterned into a prescribed shape to form a resist pattern. The aluminum film is etched according to the resist pattern to form interconnection layers 213a, 213b, 213c, and 213d. Thus, the semiconductor device shown in FIG. 18 is completed.

Such a semiconductor device produces the same effect as the semiconductor device shown in the third embodiment.

Sixth Embodiment

The semiconductor device according to the sixth embodiment of the present invention shown in FIG. 21 is an application of the semiconductor device according to the third embodiment shown in FIG. 11 to a static semiconductor memory device (hereinafter referred to as an SRAM).

As shown in FIG. 21, a memory cell 300 of an SRAM is provided with n-type access transistors 341 and 344, n-type driving transistors 21 and 31, and p-type load transistors 343 and 346.

Access transistor 341 has a pair of n-type impurity regions (source/drain region) formed within an active region 301, and a gate electrode 361 formed between the pair of impurity regions. One of the impurity regions is connected to a bit line 351 via a contact hole 321. The other impurity region is connected through a contact hole 111b to an interconnection layer 113b serving as a first storage node. Gate electrode 361 is connected to a word line.

Access transistor 344 has a pair of n-type impurity regions (source/drain region) formed within an active region 302, and gate electrode 361 formed between the pair of impurity regions. One of the impurity regions is connected to a bit line 356 via a contact hole 326. The other impurity region is connected through a contact hole 111c to an interconnection layer 113c serving as a second storage node. Gate electrode 361 is shared by two access transistors 341 and 344. Moreover, the direction in which gate electrode 361 extends is substantially orthogonal to the direction in which a pair of bit lines 351 and 356 extend.

Driving transistor 21 has a pair of n-type impurity regions (a source region and a drain region) formed within an active region 301, and a gate electrode 7a formed between the pair of impurity regions. The source region is connected to a ground node 353 via a contact hole 111a. The drain region is connected to an interconnection layer 113b via a contact hole 111b. Gate electrode 7a has a branching structure in order to connect with interconnection layer 113c, and is connected to interconnection layer 113c via a contact hole 331.

Driving transistor 31 has a pair of n-type impurity regions (a source region and a drain region) formed within an active region 302, and a gate electrode 7b formed between the pair of impurity regions. The source region is connected to a ground node 358 via a contact hole 111d. The drain region is connected to interconnection layer 113c via contact hole 111c. Interconnection layers 113b and 113c are formed spaced apart from one another extending in parallel in one direction.

Load transistor 343 has a pair of p-type impurity regions (a source region and a drain region) formed within an active region 303, and gate electrode 7a formed between the pair of impurity regions. The source region is connected to a power-supply node 355 via a contact hole 325. The drain region is connected to interconnection layer 113b via a contact hole 324. Gate electrode 7a is shared by driving transistor 21 and load transistor 343.

Load transistor 346 has a pair of p-type impurity regions (a source region and a drain region) formed within an active region 304, and gate electrode 7b formed between the pair of impurity regions. The source region is connected to a power-supply node 355 via a contact hole 330. The drain region is connected to interconnection layer 113c via a contact hole 329. Gate electrode 7b is shared by driving transistor 31 and load transistor 346.

Figure 22:
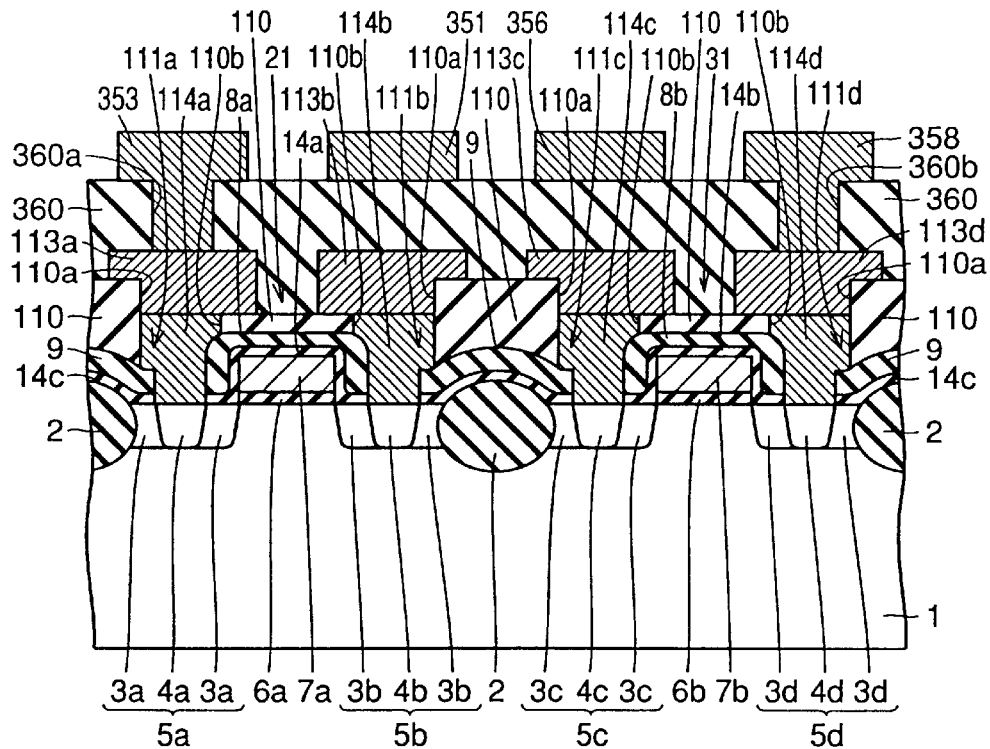
FIG. 22 is a diagram representing a cross section taken along the line XXII—XXII in FIG. 21.
Figure 23:
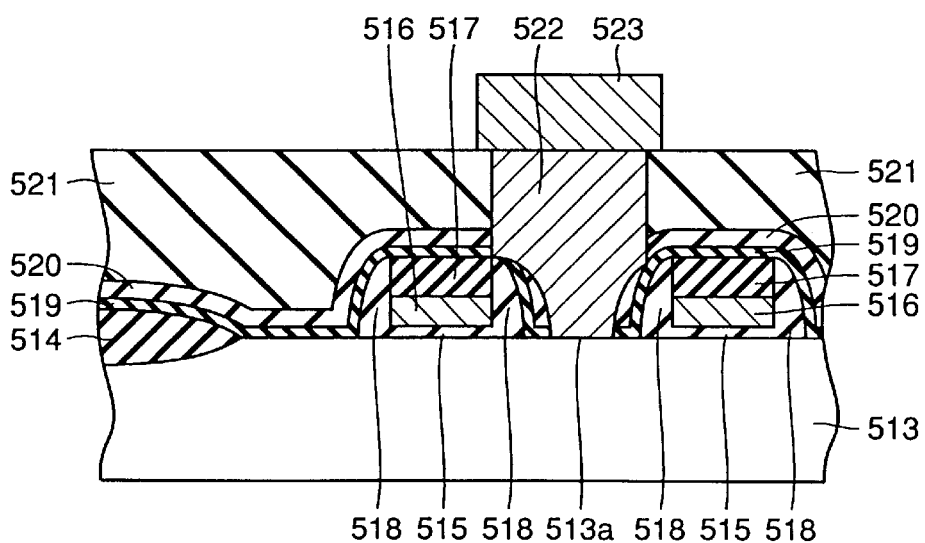
FIG. 23 is a cross sectional view of a conventional semiconductor device.

As shown in FIG. 22, the configuration of the portion below interconnection layers 113a, 113b, 113c, and 113d is the same as that in the semiconductor device according to the third embodiment shown in FIG. 11. On a surface of silicon substrate 1, low concentration impurity regions 3a, 3b, 3c, and 3d and high concentration impurity regions 4a, 4b, 4c and 4d are formed. Impurity regions 5a and 5b are formed within active region 301 of FIG. 21. Impurity region 5a corresponds to the source region of driving transistor 21, and impurity region 5b corresponds to the drain region of driving transistor 21.

Impurity regions 5c and 5d are formed within active region 302 of FIG. 21. Impurity region 5c corresponds to the drain region of driving transistor 31, and impurity region 5d corresponds to the source region of driving transistor 31.

An interlayer insulating film 110 is formed covering gate electrodes 7a and 7b. Contact holes 111a, 111b, 111c, and 111d are provided in interlayer insulating film 110. A plug layer 114a and an interconnection layer 113a correspond to a pad electrode. Moreover, a plug layer 114d and an interconnection layer 113d correspond to a pad electrode.

An interlayer insulating film 360 is formed covering interconnection layers 113a, 113b, 113c, and 113d. In interlayer insulating film 360, contact holes 360a and 360b are formed that reach interconnection layers 113a and 113d serving as pad electrodes. Ground node 353 is formed filling contact hole 360a and making contact with interconnection layer 113a. Ground node 358 is formed filling contact hole 360b and making contact with interconnection layer 113d. Further, a pair of bit lines 351 and 356 are formed on interlayer insulating film 360.

Since such an SRAM utilizes the structure according to the third embodiment, the contact resistances between plug layers 114a, 114b, 114c, and 114d and high concentration impurity regions 4a, 4b, 4c, and 4d are reduced. Moreover, the electric resistances of interconnection layers 113a, 113b, 113c, and 113d are reduced. As a result, an SRAM capable of a high-speed operation can be provided.

The descriptions of the embodiments of the present invention are as provided above. The embodiments illustrated herein may be modified in a variety of ways. First, as a material for a plug layer or an interconnection layer, not only the materials shown herein but also those utilized in a manufacturing process of a usual semiconductor device may be adapted.

Moreover, a semiconductor device shown in any one of the first to fifth embodiments can be applied not only to an SRAM but to a dynamic semiconductor memory device, a non-volatile semiconductor memory device, or the like.

Furthermore, as an etching stopper, not only a silicon nitride film but also a silicon oxynitride film or a stacked film of a silicon nitride film and a silicon oxynitride film may be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a conductive region;
   an interlayer insulating film having a hole reaching the conductive region on said semiconductor substrate;
   a conductive layer extending on said interlayer insulating film and filling said hole such that electrical connection with said conductive region is established;
   a gate electrode formed on said semiconductor substrate with a gate insulating film interposed therebetween;
   a protective film covering said gate electrode and having an etching rate that is smaller than an etching rate of said interlayer insulating film when using a prescribed etchant; and
   an isolating oxide film provided on the surface of the semiconductor substrate, the conductive region being positioned between the isolating oxide film and the gate electrode; wherein:
   said hole is defined by one sidewall and the other sidewall lower than said one sidewall of said interlayer insulating film;

one sidewall is positioned on either the isolating oxide film or the gate electrode, and the other sidewall is positioned on the other; and the thickness of the conductive layer on the other sidewall is greater than the thickness of the conductive layer on one sidewall.

2. The semiconductor device according to claim 1, wherein said protective film includes a nitride film, and said interlayer insulating film includes an oxide film.

3. The semiconductor device according to claim 2, wherein said protective film is at least one of a silicon oxynitride film and a silicon nitride film, and said interlayer insulating film is a silicon oxide film.

4. The semiconductor device according to claim 1, wherein said conductive region includes a low concentration impurity region being formed close to said gate electrode, and a high concentration impurity region having a impurity concentration than that of said low concentration impurity region and being formed at a location remote from said gate electrode.

5. The semiconductor device according to claim 4, wherein said low concentration impurity region is formed by implanting an impurity into said semiconductor substrate using said gate electrode as a mask, and said high concentration impurity region is formed by implanting an impurity into said semiconductor substrate through said hole.

6. The semiconductor device according to claim 4, wherein said conductive layer includes a plug layer filling said hole such that electrical connection with said high concentration impurity region is established, and an interconnection layer formed on said interlayer insulating film such that electrical connection with said plug layer is estabilshed.

7. The semiconductor device according to claim 1, wherein said semiconductor device is a static semiconductor memory device.

8. A method of manufacturing a semiconductor device, comprising the steps of:

forming a gate electrode on a semiconductor substrate with a gate insulting film interposed therebetween;

implanting an impurity into said semiconductor substrate using said gate electrode as a mask to form a pair of low concentration impurity regions having a relatively low impurity concentration and being spaced apart from one another on a surface of said semiconductor substrate;

forming a protective film covering said gate electrode and said semiconductor substrate;

forming an interlayer insulating film covering said gate electrode and said protective film and having an etching rate greater than an etching rate of said protective film when using a prescribed etchant;

etching said interlayer insulating film with a condition that an etching rate of said interlayer insulating film is greater than an etching rate of said protective film to expose said protective film, and thereafter, etching said protecting film with a condition that an etching rate of said protective film is greater than an etching rate of said interlayer insulating film to form a hole reaching each of said low concentration impurity regions in said interlayer insulating film;

implanting an impurity into said semiconductor substrate through said hole to form a high concentration impurity region having a relatively high impurity concentration within each of said low concentration impurity regions;

depositing a conductive material on said interlayer insulting film to fill said hole; and etching said conductive material while leaving said conductive material within said hole to form a conductive layer electrically connected to said high concentration impurity region, wherein said step of forming said conductive layer includes etching back entire surface of said conductive material while leaving the conductive material within said hole to form a plug layer electrically connected to said high concentration impurity region; and forming an interconnection layer on said interlayer insulating film such that electrical connection with said plug layer is established.

9. A method of manufacturing a semiconductor device, comprising the steps of:

forming an interlayer insulating film on a semiconductor substrate having a conductive region;

etching said interlayer insulating film to form in said interlayer insulating film a hole that reaches said conductive region and that is defined by a pair of sidewalls opposing one another;

forming a resist to cover one sidewall and to fill said hole;

removing a portion of said interlayer insulating film using said resist as a mask such that other sidewall becomes lower in height;

depositing a conductive material on said interlayer insulating film to fill said hole; and etching said conductive material while leaving said conductive material within said hole to form a conductive layer electrically connected to said conductive region.

10. The method of manufacturing a semiconductor device according to claim 9, wherein said step of forming said conductive layer includes etching back entire surface of said conductive material while leaving said conductive material within said hole to form a plug layer electrically connected to said conductive region; and forming an interconnection layer on said interlayer insulating film such that electrical connection with said plug layer is established.

* * * * *